United States Patent
Hashimoto et al.

(10) Patent No.: US 7,872,285 B2
(45) Date of Patent: Jan. 18, 2011

(54) VERTICAL GALLIUM NITRIDE SEMICONDUCTOR DEVICE AND EPITAXIAL SUBSTRATE

(75) Inventors: Shin Hashimoto, Itami (JP); Makoto Kiyama, Itami (JP); Tatsuya Tanabe, Itami (JP); Kouhei Miura, Osaka (JP); Takashi Sakurada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 397 days.

(21) Appl. No.: 11/569,798

(22) PCT Filed: Mar. 1, 2006

(86) PCT No.: PCT/JP2006/303828

§ 371 (c)(1),
(2), (4) Date: Nov. 30, 2006

(87) PCT Pub. No.: WO2006/093174

PCT Pub. Date: Sep. 8, 2006

(65) Prior Publication Data

US 2009/0194796 A1 Aug. 6, 2009

(30) Foreign Application Priority Data

Mar. 4, 2005 (JP) ............................. 2005-061174

(51) Int. Cl.
*H01L 29/66* (2006.01)
*H01L 29/207* (2006.01)
*H01L 29/20* (2006.01)

(52) U.S. Cl. ................ 257/263; 257/192; 257/280; 257/329; 257/609; 257/615; 257/E29.093; 257/E29.262; 257/E29.318

(58) Field of Classification Search ............. 257/192, 257/329, 609, 280, 615, E29.262, E29.318, 257/E29.093
See application file for complete search history.

(56) References Cited

U.S. PATENT DOCUMENTS 6,049,108 A 4/2000 Williams et al.

(Continued)

FOREIGN PATENT DOCUMENTS

JP H04-233764 A 8/1992

(Continued)

OTHER PUBLICATIONS

K. H. Baik et al., "Design of Junction Termination Structures for GaN Schottky Power Rectifiers," Solid-State Electronics, 2003, pp. 975-979, vol. 47, No. 6, Elsevier Science, Barking, GB.

(Continued)

*Primary Examiner*—Zandra Smith
*Assistant Examiner*—Jeremy J Joy
(74) *Attorney, Agent, or Firm*—James W. Judge

(57) ABSTRACT

Affords epitaxial substrates for vertical gallium nitride semiconductor devices that have a structure in which a gallium nitride film of n-type having a desired low carrier concentration can be provided on a gallium nitride substrate of n type. A gallium nitride epitaxial film (65) is provided on a gallium nitride substrate (63). A layer region (67) is provided in the gallium nitride substrate (63) and the gallium nitride epitaxial film (65). An interface between the gallium nitride substrate (43) and the gallium nitride epitaxial film (65) is positioned in the layer region (67). In the layer region (67), a peak value of donor impurity along an axis from the gallium nitride substrate (63) to the gallium nitride epitaxial film (65) is $1\times10^{18}$ cm$^{-3}$ or more. The donor impurity is at least either silicon or germanium.

22 Claims, 6 Drawing Sheets

U.S. PATENT DOCUMENTS

| | | | |
|---|---|---|---|
| 6,107,649 A * | 8/2000 | Zhao | 257/138 |
| 6,396,085 B1 * | 5/2002 | Yoshida | 257/135 |
| 6,447,604 B1 * | 9/2002 | Flynn et al. | 117/89 |
| 6,501,145 B1 * | 12/2002 | Kaminski et al. | 257/471 |
| 6,580,101 B2 * | 6/2003 | Yoshida | 257/192 |
| 2001/0032999 A1 * | 10/2001 | Yoshida | 257/332 |
| 2003/0020136 A1 * | 1/2003 | Kitabatake et al. | 257/502 |
| 2003/0096464 A1 * | 5/2003 | Lanois | 438/173 |
| 2003/0098462 A1 * | 5/2003 | Yoshida | 257/183 |
| 2008/0173876 A1 * | 7/2008 | Ueno | 257/77 |
| 2008/0251801 A1 * | 10/2008 | Ueno et al. | 257/94 |

FOREIGN PATENT DOCUMENTS

| | | | |
|---|---|---|---|
| JP | 05102497 A * | 4/1993 | |
| JP | H05-102497 A | 4/1993 | |
| JP | 2002-261275 A | 9/2002 | |
| JP | 2002-373864 A | 12/2002 | |
| JP | 2003-318388 A | 11/2003 | |
| JP | 2004-047764 A | 2/2004 | |
| JP | 2005-033132 A | 2/2005 | |
| WO | WO-2004-061923 A1 | 7/2004 | |

OTHER PUBLICATIONS

X. A. Cao et al., "Blue and Near-Ultraviolet Light-Emitting Diodes on Free-Standing GaN Substrates," Applied Physics Letters, May 24, 2004, pp. 4313-4315, vol. 84, No. 21, American Institute of Physics, NY.

Y. Irokawa, et al., "Current-Voltage and Reverse Recovery Characteristics of Bulk GaN p-i-n Rectifiers," Applied Physics Letters, Sep. 15, 2003, pp. 2271-2273, vol. 83, No. 11, American Insutitute of Physics, NY.

* cited by examiner

VERTICAL GALLIUM NITRIDE SEMICONDUCTOR DEVICE AND EPITAXIAL SUBSTRATE

TECHNICAL FIELD

The present invention relates to vertical gallium nitride semiconductor devices and epitaxial substrates.

BACKGROUND ART

In Patent Document 1, a gallium nitride single crystal growth process is disclosed. According to this process, a gallium nitride single-crystal growth process enabling oxygen to be taken in as an n-type dopant is afforded. In this process, using a seed crystal having the plane apart from the c-plane on the front side (top side), while a source gas including raw-material gallium, raw-material nitrogen, and oxygen for doping is supplied, gallium nitride crystal is vapor-deposited, with the front side apart from the c-plane being kept intact, to dope oxygen into the gallium nitride crystal through the front side. In another instance, using a seed crystal having the c-plane on the front side, while a source gas including raw-material gallium, raw-material nitrogen, and oxygen for doping is supplied, gallium nitride crystal is vapor-deposited along the c-axis, with a facet plane apart from the c-plane being created and the facet plane being kept intact, to dope oxygen into the gallium nitride crystal through the facet plane.

Non-Patent Document 1 describes characteristics of pin diodes. In these diodes an (undoped, n ~3×10$^{16}$ cm$^{-3}$, 3 micrometers) gallium nitride epitaxial film and a (Mg-doped, p~1×10$^{17}$ cm$^{-3}$, 0.3 micrometers) gallium nitride epitaxial film are fabricated by metalorganic vapor deposition onto a gallium nitride freestanding substrate, and on the back side of the gallium nitride freestanding substrate, an ohmic electrode for the n-type is fabricated, and on the front side of the epitaxial film, an ohmic electrode for the p-type.

Patent Document 1: Japanese Unexamined Pat. App. Pub. No. 2002-373864. Non-Patent Document 1: Irokawa et al., *Applied Physics Letters*, Vol. 83, 15 Sep. 2003, pp. 2271-2273.

DISCLOSURE OF INVENTION

Problems Invention is to Solve

In the gallium nitride vertical electronic device, an n$^-$-type gallium nitride film is epitaxially grown on the n-type gallium nitride substrate. According to experiments by the inventors, it was found that unintentional impurities such as magnesium (Mg) and iron (Fe) were concentrated in the vicinity a depth of 1 μM or less of the interface between the gallium nitride substrate and the epitaxial film. Peak concentration of these impurities is on the order of 10$^{17}$ cm$^{-3}$, and this impurity peak makes it difficult to provide a gallium nitride film having a designed low carrier concentration at a region in the vicinity of the interface. Impurities such magnesium (Mg), beryllium (Be), calcium (Ca), zinc (Zn), cadmium (Cd), iron (Fe), titanium (Ti), cobalt (Co), nickel (Ni), vanadium (V), chromium (Cr), or manganese (Mn) reduce carriers in the vicinity of the interface between the gallium nitride substrate and the epitaxial film, and make the region in the vicinity of the interface highly resistant. Therefore, it is desirable to provide an epitaxial film having a low carrier concentration on an n-type gallium nitride substrate.

An object of the present invention, brought about taking the above-described circumstances into consideration, is to make available vertical gallium nitride semiconductor devices and epitaxial substrates for the vertical gallium nitride semiconductor devices whose structure makes it possible to realize n-type gallium nitride films having a desired low carrier concentration on n-type gallium nitride substrates.

Means for Resolving the Problems

One aspect of the present invention involves a vertical gallium nitride semiconductor device furnished with: (a) a gallium nitride support base of n$^+$-type conductivity; (b) a gallium nitride epitaxial film of n$^-$-type conductivity provided on a principal surface of the gallium nitride support base; (c) a gate insulating film provided on the gallium nitride epitaxial film; (d) a gate electrode provided on the gate insulating film; (e) a p-type conductivity region provided in the gallium nitride epitaxial film; (f) an n-type conductivity region provided in the p-type conductivity region; (g) a source electrode provided on the n-type conductivity region of the gallium nitride epitaxial film; and (h) a drain electrode provided on a back side of the gallium nitride support base. A layer region is provided in the surface of the gallium nitride support base and the gallium nitride epitaxial film in which concentration of donor impurity along an axis from the gallium nitride support base to the gallium nitride epitaxial film is 1×10$^{18}$ cm$^{-3}$ or more, and the donor impurity is at least either silicon or germanium.

Another aspect of the present invention involves a vertical gallium nitride semiconductor device furnished with: (a) a gallium nitride support base of n-type conductivity; (b) a gallium nitride epitaxial film of n$^-$-type conductivity provided on a principal surface of the gallium nitride support base; (c) a Schottky electrode provided on the gallium nitride epitaxial film; and (d) an ohmic electrode provided on a back side of the gallium nitride support base. A layer region is provided in the surface of the gallium nitride support base and the gallium nitride epitaxial film in which concentration of donor impurity along an axis from the gallium nitride support base to the gallium nitride epitaxial film is 1×10$^{18}$ cm$^{-3}$ or more, and the donor impurity is at least either silicon or germanium.

A still further aspect of the present invention involves a vertical gallium nitride semiconductor device furnished with: (a) a gallium nitride support base of n-type conductivity; (b) a gallium nitride epitaxial film of n$^-$-type conductivity provided on a principal surface of the gallium nitride support base; (c) a gallium nitride epitaxial film of p-type conductivity provided on the gallium nitride epitaxial film of n$^-$-type conductivity; (d) a first ohmic electrode provided on the gallium nitride epitaxial film of p-type conductivity; and (e) a second ohmic electrode provided on a back side of the gallium nitride support base. A layer region is provided in the surface of the gallium nitride support base and the gallium nitride epitaxial film of n$^-$-type conductivity in which concentration of donor impurity along an axis from the gallium nitride support base to the gallium nitride epitaxial film of n$^-$-type conductivity is 1×10$^{18}$ cm$^{-3}$ or more, and the donor impurity is at least either silicon or germanium.

According to the above vertical gallium nitride semiconductor device, since the donor impurity concentration profile of the layer region is 1×10$^{18}$ cm$^{-3}$ or more, it is possible to reduce the decrease in the carrier concentration due to impurities such as magnesium (Mg) and iron (Fe) in the vicinity of the interface between the gallium nitride substrate and the epitaxial film.

In the vertical gallium nitride semiconductor device according to the present invention, it is preferable that donor concentration of the gallium nitride epitaxial film is $5 \times 10^{17}$ cm$^{-3}$ or less, and the donor impurity of the gallium nitride support base includes oxygen or silicon.

According to the vertical gallium nitride semiconductor device, a depletion layer can be sufficiently formed in the gallium nitride epitaxial film, and it is possible to reduce the decrease in the carrier in the vicinity of the interface between the gallium nitride substrate and the epitaxial film.

In the vertical gallium nitride semiconductor device according to the present invention, a peak in the concentration profile of magnesium, beryllium, calcium, zinc, or cadmium resides in the layer region. According to vertical gallium nitride semiconductor device, the decrease in the carrier due to magnesium, beryllium, calcium, zinc, or cadmium serving as p-type dopant can be reduced in the vicinity of the interface between the gallium nitride substrate and the epitaxial film.

In the vertical gallium nitride semiconductor device according to the present invention, a peak in the concentration profile of iron, titanium, cobalt, nickel, vanadium, chromium, or manganese resides in the layer region. According to vertical gallium nitride semiconductor device, the carrier decrease originating in iron, titanium, cobalt, nickel, vanadium, chromium, or manganese, which act as lifetime killers, can be reduced in the vicinity of the interface between the gallium nitride substrate and the epitaxial film.

A still further aspect of the present invention involves an epitaxial substrate furnished with: (a) a gallium nitride substrate of n-type conductivity; and (b) a gallium nitride epitaxial film of n$^-$-type conductivity provided on the gallium nitride substrate. A layer region is provided in the surface of the gallium nitride substrate and the gallium nitride epitaxial film in which concentration of donor impurity along an axis from the gallium nitride substrate to the gallium nitride epitaxial film is $1 \times 10^{18}$ cm$^{-3}$ or more, and the donor impurity is at least either silicon or germanium.

A still further aspect of the present invention involves an epitaxial substrate furnished with: (a) a gallium nitride substrate of n-type conductivity; (b) a gallium nitride epitaxial film of n$^-$-type conductivity provided on the gallium nitride substrate; and (c) a gallium nitride epitaxial film of p-type conductivity provided on the gallium nitride epitaxial film of n$^-$-type conductivity. A layer region is provided in the surface of the gallium nitride substrate and the gallium nitride epitaxial film in which concentration of donor impurity along an axis from the gallium nitride substrate to the gallium nitride epitaxial film of n$^-$-type conductivity is $1 \times 10^{18}$ cm$^{-3}$ or more, and the donor impurity is at least either silicon or germanium.

According to the epitaxial substrate, since the donor impurity concentration profile of the layer region is $1 \times 10^{18}$ cm$^{-3}$ or more, it is possible to reduce the decrease in the carrier concentration due to impurities such as magnesium (Mg) and iron (Fe) in the vicinity of the interface between the gallium nitride substrate and the epitaxial film. Consequently, the epitaxial substrate for the vertical gallium nitride semiconductor device is made available.

In an epitaxial substrate according to the present invention, donor concentration of the gallium nitride epitaxial film is $5 \times 10^{17}$ cm$^{-3}$ or less, and the gallium nitride substrate includes oxygen or silicon as a donor impurity.

According to the epitaxial substrate, a depletion layer can be sufficiently formed in the gallium nitride epitaxial film, and it is possible to reduce the decrease in the carrier in the vicinity of the interface between the gallium nitride substrate and the epitaxial film.

In an epitaxial substrate according to the present invention, a peak in the concentration profile of magnesium, beryllium, calcium, zinc, or cadmium resides in the layer region. According to the epitaxial substrate, the carrier decrease originating in magnesium, beryllium, calcium, zinc, or cadmium, which act as p-type dopants, can be reduced in the vicinity of the interface between the gallium nitride substrate and the epitaxial film.

In an epitaxial substrate according to the present invention, a peak in the concentration profile of iron, titanium, cobalt, nickel, vanadium, chromium, or manganese resides in the layer region. According to the epitaxial substrate, the decrease in the carrier due to iron, titanium, cobalt, nickel, vanadium, chromium, or manganese serving as a lifetime killer can be reduced in the vicinity of the interface between the gallium nitride substrate and the epitaxial film.

From the following detailed description, proceeding with reference to the accompanying drawings as illustrations, the above-described objects and the other objects, features, and advantages of the present invention will become readily apparent.

EFFECTS OF THE INVENTION

As described above, according to the present invention, a vertical gallium nitride semiconductor device is made available that has a structure in which a gallium nitride film of n$^-$ type having a desired low carrier concentration on a gallium nitride substrate of n type. Furthermore, according to the present invention, an epitaxial substrate for the vertical gallium nitride semiconductor device is made available.

LEGEND

Figure 1:
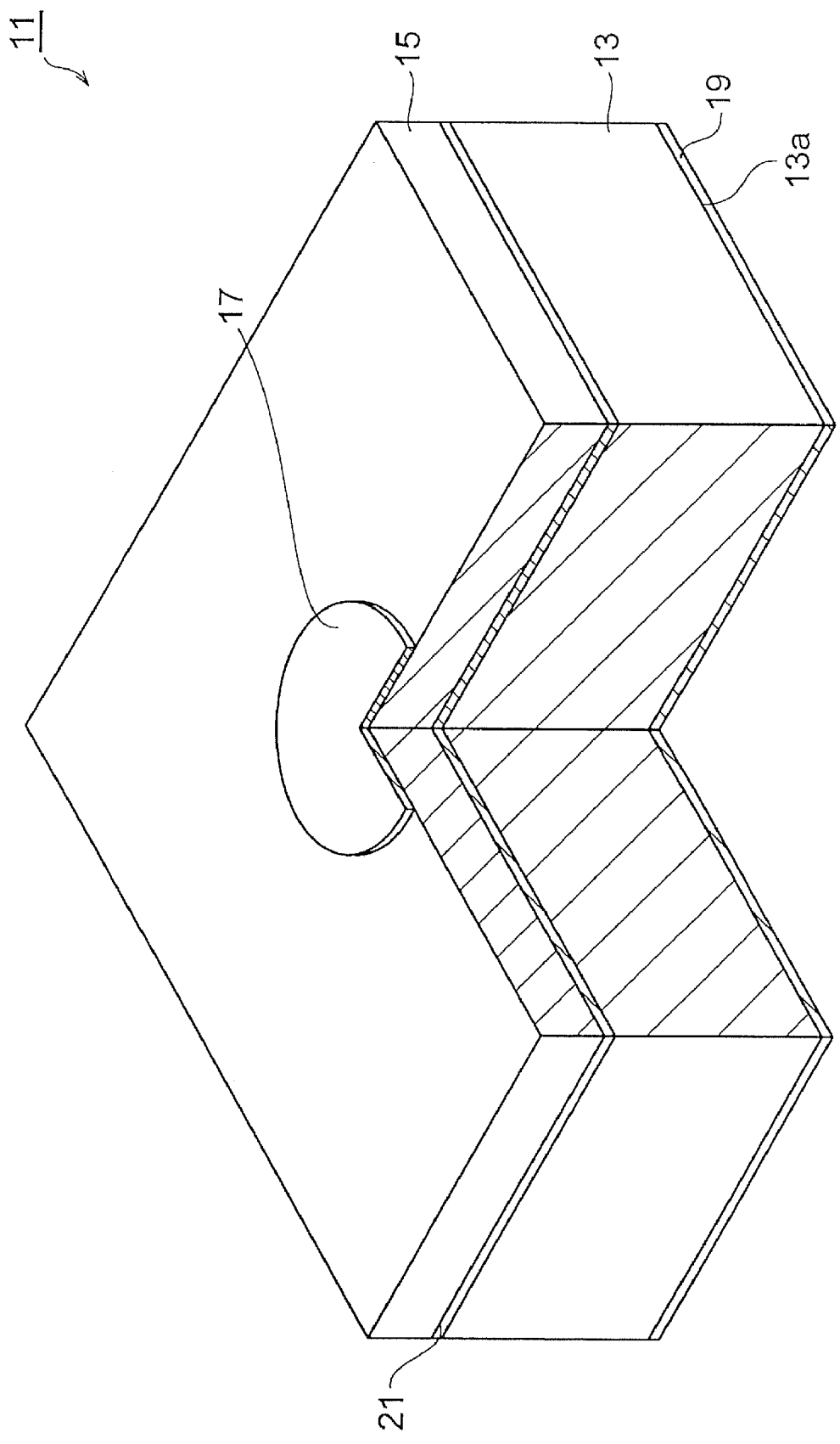
FIG. 1 is a view depicting a Schottky diode.

11: Schottky diode
13: gallium nitride support base of n-type conductivity
15: gallium nitride epitaxial film of n$^-$-type conductivity
17: Schottky electrode
19: ohmic electrode
17: Schottky electrode
19: ohmic electrode
21: layer region
41: vertical transistor
43: gallium nitride support base of n-type conductivity
45: gallium nitride epitaxial film of n$^-$-type conductivity
47: gate electrode
49: p-type conductivity region
51: n$^+$-type conductivity region
53: source electrode
55: drain electrode
57: layer region 59: insulating film
61: epitaxial substrate
63: gallium nitride substrate of n-type conductivity
65: gallium nitride epitaxial film of n⁻-type conductivity
67: layer region
71: pn junction diode
73: gallium nitride epitaxial film of p-type conductivity
75: gallium nitride epitaxial film of n⁻-type conductivity
77: first ohmic electrode
79: second ohmic electrode
76: pn junction

BEST MODE FOR CARRYING OUT THE INVENTION

From the following detailed description, proceeding with reference to the accompanying drawings as illustrations, the above-described objects and the other objects, features, and advantages of the present invention will become readily apparent. Hereinafter, referring to the accompanying figures, embodiments of the present invention concerning vertical gallium nitride semiconductor devices and epitaxial substrates will be described. Identical reference marks are provided to identical parts, if possible.

Embodiment Mode 1

FIG. 1 is a view of a Schottky diode. The Schottky diode 11 is made up of a gallium nitride support base 13 of n⁺-type conductivity, a gallium nitride epitaxial film 15 of n⁻-type conductivity, a Schottky electrode 17, and an ohmic electrode 19. The gallium nitride epitaxial film 15 is provided on the principal surface of the gallium nitride support base 13. The Schottky electrode 17 is provided on the gallium nitride epitaxial film 15. The ohmic electrode 19 is provided on a back side 13a of the gallium nitride support base 13. A layer region 21 is provided in the gallium nitride support base 13 and the gallium nitride epitaxial film 15. The interface between the gallium nitride support base 13 and the gallium nitride epitaxial film 15 is positioned in the layer region 21. In the layer region 21, donor impurity along an axis from the gallium nitride support base 13 to the gallium nitride epitaxial film 15 is $1 \times 10^{18}$ cm$^{-3}$ or more. The donor impurity is at least either silicon or germanium.

According to the Schottky diode 11, a concentration profile of the donor impurity of the layer region 21 has a peak value of $1 \times 10^{18}$ cm$^{-3}$ or more, so that decrease in the carrier concentration due to impurities such as magnesium (Mg) and iron (Fe) in the vicinity of the interface between the gallium nitride substrate and the epitaxial film can be reduced.

The donor concentration of the gallium nitride epitaxial film 15 may be $5 \times 10^{17}$ cm$^{-3}$ or less, and the gallium nitride support base 13 may contain oxygen as a donor impurity. Alternatively, the gallium nitride support base 13 may contain silicon as a donor impurity. According to the Schottky diode, a depletion layer can be sufficiently formed in the gallium nitride epitaxial film 15, and the decrease in the carrier concentration in the vicinity of the interface between the gallium nitride support base and the epitaxial film can be reduced.

Implementation Example 1

Following a procedure described hereinafter, an epitaxial substrate was manufactured. A gallium nitride (GaN) freestanding substrate manufactured by HVPE method was prepared. The GaN freestanding substrate had a principal surface of (0001) plane, and showed n⁺ conductivity. The substrate had a carrier concentration of $3 \times 10^{18}$ cm$^{-3}$ and a thickness of 400 μm. The average dislocation density in the substrate was $1 \times 10^6$ cm$^{-2}$ or less. A GaN epitaxial film was grown on the principal surface of the freestanding substrate by metal organic chemical vapor deposition. The epitaxial film had n⁻-type conductivity. The film had a carrier concentration of $5 \times 10^{15}$ cm$^{-3}$ and a thickness of 3.3 μm. At an interface between the GaN freestanding substrate and the GaN epitaxial film was formed an n⁺ GaN layer region including silicon (Si) having a carrier concentration of $5 \times 10^{18}$ cm$^{-3}$. In order to form the layer region, silicon could be added to the surface layer of the substrate or the epitaxial film.

Next, using the epitaxial substrate, a Schottky diode was manufactured following a procedure described hereinafter. After the organic washing of the sample, an ohmic electrode was formed on the whole area of the back side of the GaN freestanding substrate. The ohmic electrode was composed of Ti/Al/Ti/Au (20 nm/100 nm/20 nm/300 nm). In order to form the ohmic electrode, after depositing metal laminated films by EB vapor deposition method, an alloying process was performed (at 600 degrees Celsius, for one minute). In addition, a Schottky electrode was formed on the surface of the epitaxial film. The Schottky electrode was an Au film having a diameter of 200 μm, for example. In order to form the Schottky electrode, a metallic film was deposited by resistance heating deposition. The samples of both the Schottky electrode and the ohmic electrode were pretreated (for example, at room temperature for one minute) with aqueous hydrochloric acid (hydrochloric acid for semiconductors:pure water=1:1) in advance of the deposition.

Figure 2:
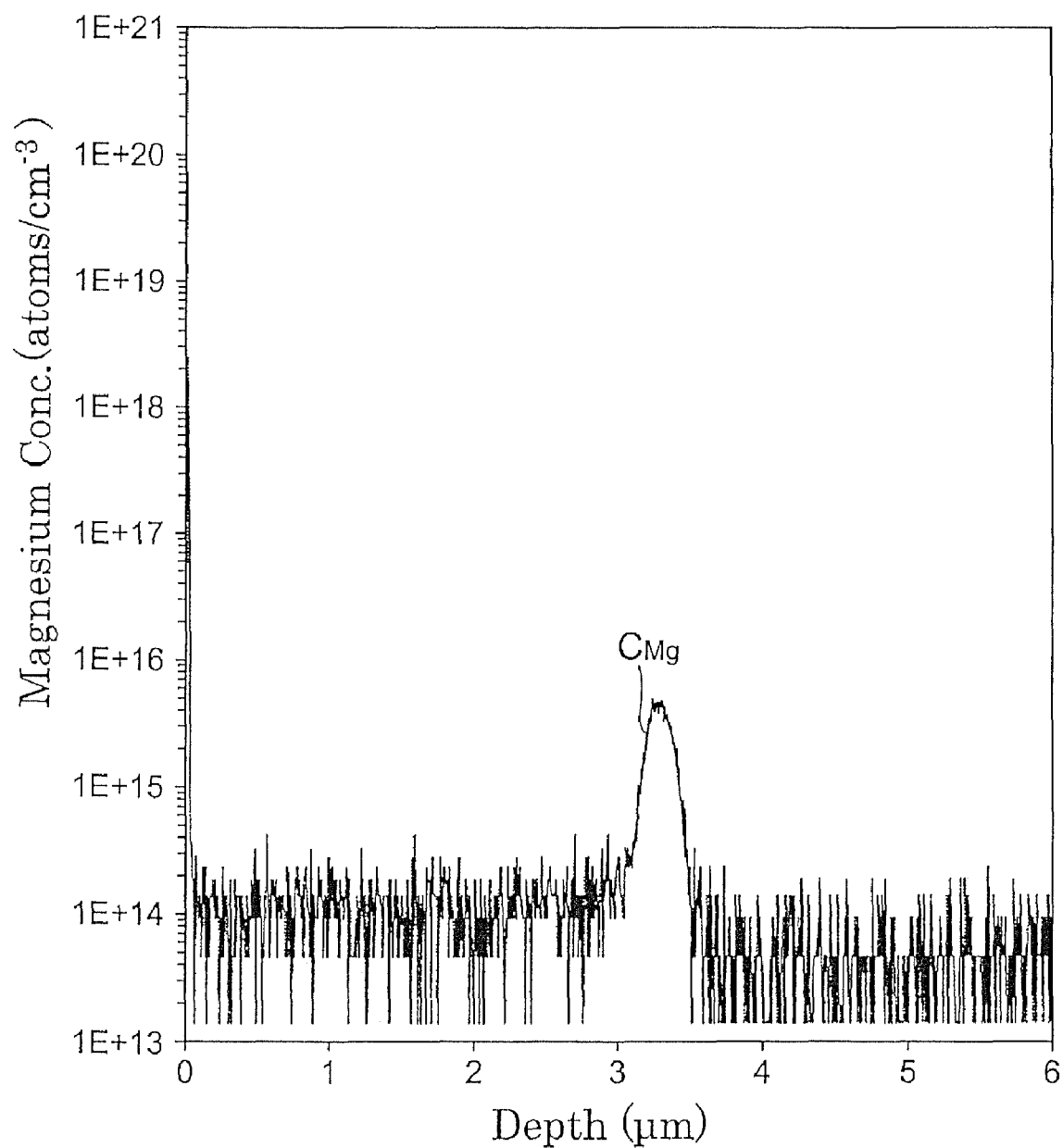
FIG. 2 is a graph plotting the magnesium (Mg) concentration in the above-mentioned epitaxial substrate by secondary ion mass spectrometry.

FIG. 2 is a graph plotting the magnesium (Mg) concentration in the above-described epitaxial substrate by secondary ion mass spectrometry. A peak of the concentration curve $C_{Mg}$ was positioned in the vicinity of the interface between the gallium nitride substrate and the epitaxial film. The peak concentration was $1 \times 10^{16}$ cm$^{-3}$ or less.

Figure 3:
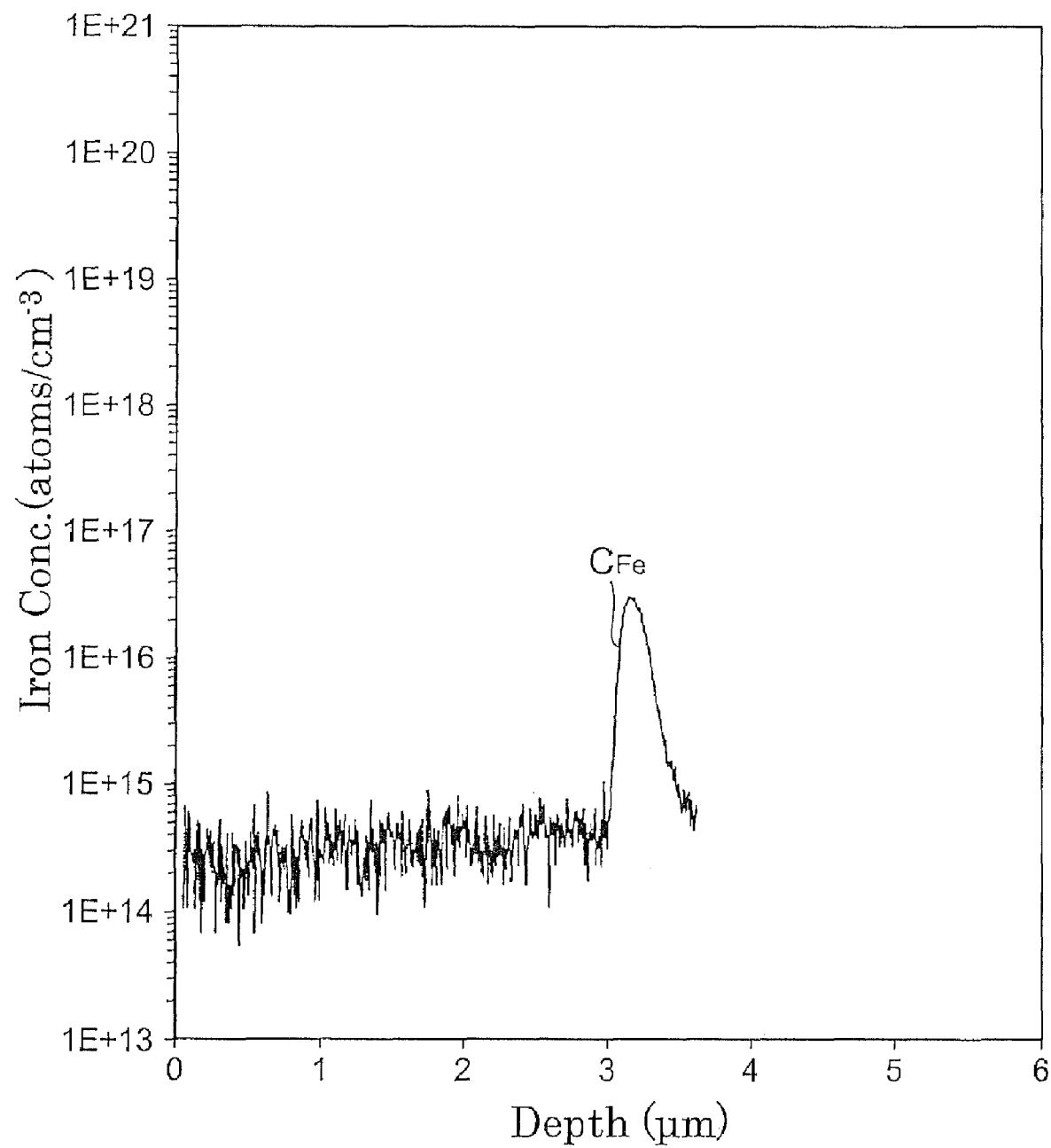
FIG. 3 is a graph plotting the iron (Fe) concentration in the above-mentioned epitaxial substrate by secondary ion mass spectrometry.

FIG. 3 is a graph plotting the iron (Fe) concentration in the above-described epitaxial substrate by secondary ion mass spectrometry. A peak of the concentration curve CFe was positioned in the vicinity of the interface between the gallium nitride substrate and the epitaxial film. The peak concentration was $1 \times 10^{17}$ cm$^{-3}$ or less.

Figure 4:
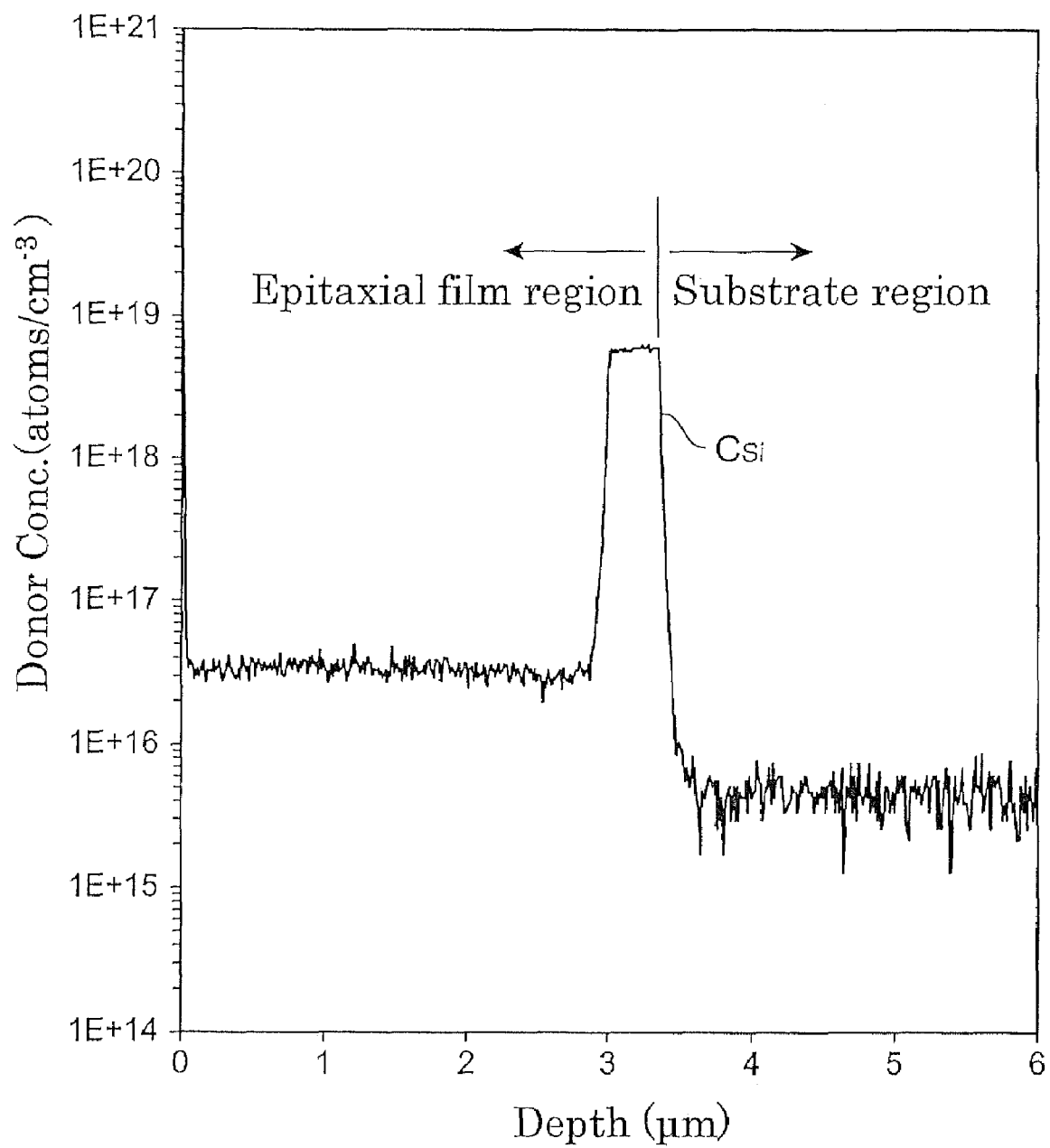
FIG. 4 is a graph plotting the donor concentration (silicon) in a layer region of the above-described epitaxial substrate by secondary ion mass spectrometry.

FIG. 4 is a graph plotting the donor concentration (silicon) in the layer region of the above-described epitaxial substrate by secondary ion mass spectrometry. A peak of the concentration curve $C_{Si}$ was positioned in the vicinity of the interface between the gallium nitride substrate and the epitaxial film. Since the donor impurity concentration profile of the layer region had a peak value of $1 \times 10^{18}$ cm$^{-3}$ or more, decrease in the carrier concentration due to impurities such as magnesium (Mg) and iron (Fe) in the vicinity of the interface between the gallium nitride substrate and the epitaxial film can be reduced. Although the thickness of the layer region was greater than the depth of the distribution of the above-described impurities, it was 1 μm or less, for example. It can reduce the decrease in the carrier concentration due to impurities such as beryllium (Be), calcium (Ca), zinc (Zn), cadmium (Cd), titanium (Ti), cobalt (Co), nickel (Ni), vanadium (V), chromium (Cr), and manganese (Mn) as well as magnesium (Mg) and iron (Fe).

Embodiment Mode 2

Figure 5:
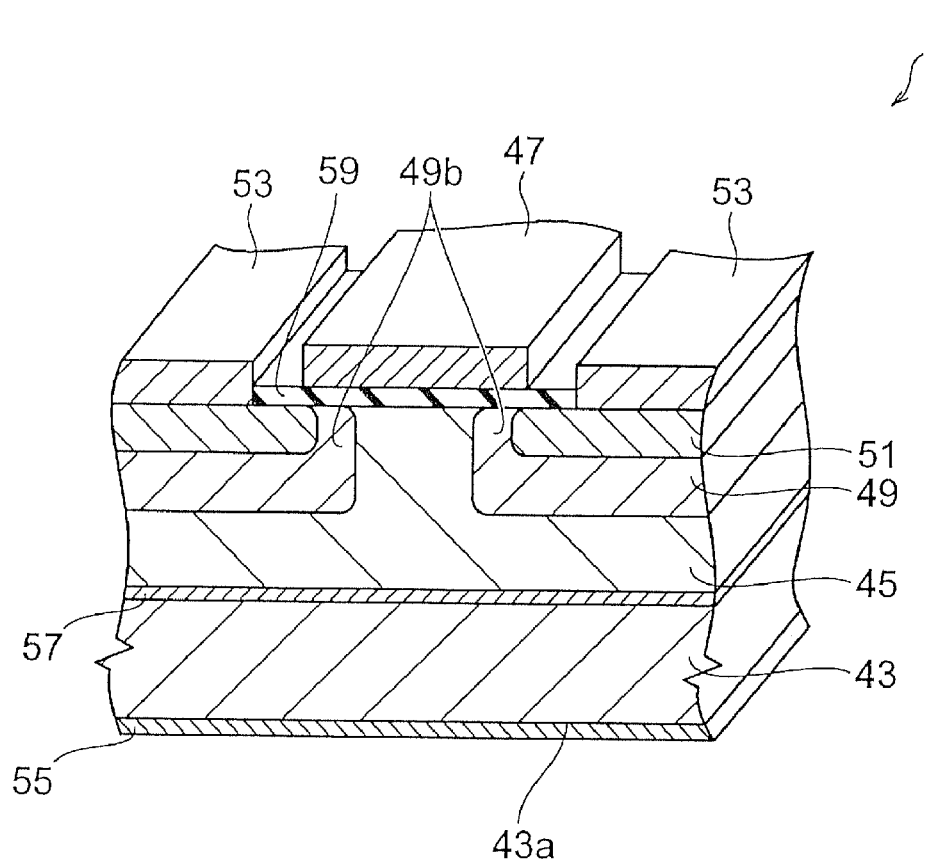
FIG. 5 is a view depicting a vertical transistor.

FIG. 5 is a view depicting a vertical transistor. The vertical transistor 41 is made up of a gallium nitride support base 43 of n⁺-type conductivity, a gallium nitride epitaxial film 45 of n⁻-type conductivity, a gate electrode 47, a p-type conductivity region 49, an n⁺-type conductivity region 51, a source electrode 53, and a drain electrode 55. The gallium nitride epitaxial film 45 is provided on the principal surface of the gallium nitride support base 43. The gate electrode 47 is provided on the gallium nitride epitaxial film 45. Below the gate electrode 47 is provided an extended portion 49b of the p-type conductivity region 49. The p-type conductivity region 49 is provided on the gallium nitride epitaxial film 45. The n⁺-type conductivity region 51 is provided on the p-type conductivity region 49. The source electrode 53 is provided on the n⁺-type conductivity region 51 in the gallium nitride epitaxial film 45. The drain electrode 55 is provided on a back side 43a of the gallium nitride support base 43. A gate insulating film 59 is provided between the gallium nitride epitaxial film 45 and the gate electrode 47. As a material for the gate insulating film 59, a silicon dioxide film, a silicon oxynitride film, a silicon nitride film, alumina, aluminum nitride, AlGaN can be used.

A layer region 57 is provided in the gallium nitride support base 43 and the gallium nitride epitaxial film 45. An interface between the gallium nitride support base 43 and the gallium nitride epitaxial film 45 is positioned in the layer region 57. In the layer region 57, donor impurity along an axis from the gallium nitride support base 43 to the gallium nitride epitaxial film 45 is $1 \times 10^{18}$ cm$^{-3}$ or more. The donor impurity is at least either silicon or germanium.

According to the vertical transistor 41, a concentration profile of the donor impurity of the layer region 57 has a peak value of $1 \times 10^{18}$ cm$^{-3}$ or more, so that the decrease in the carrier due to impurities such as magnesium (Mg) and iron (Fe) in the vicinity of the interface between the gallium nitride support base and the epitaxial film can be reduced. It can reduce the decrease in the carrier concentration due to impurities such as beryllium (Be), calcium (Ca), zinc (Zn), cadmium (Cd), titanium (Ti), cobalt (Co), nickel (Ni), vanadium (V), chromium (Cr), and manganese (Mn) as well as magnesium (Mg) and iron (Fe).

As described above, the gallium nitride vertical electronic devices 11 and 41 include the homoepitaxial films 15 and 45 of low concentration on the gallium nitride substrate 13 and 43, respectively. However, since the impurities such as magnesium and iron are likely to be concentrated in the vicinity of the interface between the gallium nitride substrate and the homoepitaxial film, it is difficult to control the carrier concentration in the vicinity of the interface, where the concentration is low. Therefore, the present invention makes use of the layer region having a relatively high concentration provided in the vicinity of the interface in order to reduce the affect of the above-descried impurities and to maintain the carrier concentration of the epitaxial film apart from the interface to a desired low concentration. Furthermore, it is possible to remove the electrical affects due to the affects by the impurities, so that forward resistance or on-resistance of the gallium nitride vertical electronic devices 11 and 41 can be reduced and the backward breakdown voltage can be improved.

Embodiment Mode 3

Figure 6:
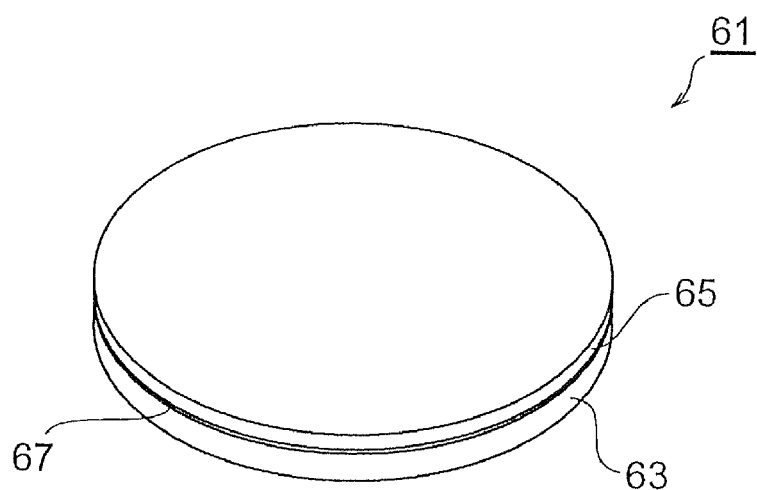
FIG. 6 is a view depicting an epitaxial substrate.

FIG. 6 is a view depicting an epitaxial substrate. The epitaxial substrate 61 is manufactured according to a following process. The epitaxial substrate 61 is made up of a gallium nitride substrate 63 of n⁺-type conductivity, and a gallium nitride epitaxial film 65 of n⁻-type conductivity. The gallium nitride epitaxial film 65 is provided on the gallium nitride substrate 63. A layer region 67 is provided in the gallium nitride substrate 63 and the gallium nitride epitaxial film 65. An interface between the gallium nitride substrate 63 and the gallium nitride epitaxial film 65 is positioned in the layer region 67. In the layer region 67, donor impurity along an axis from the gallium nitride substrate 63 to the gallium nitride epitaxial film 65 has a peak value of $1 \times 10^{18}$ cm$^{-3}$ or more. The donor impurity is at least either silicon or germanium.

According to the epitaxial substrate 61, a concentration profile of the donor impurity of the layer region 67 has a peak value of $1 \times 10^{18}$ cm$^{-3}$ or more, so that it is possible to reduce the decrease in the carrier concentration due to impurities such as magnesium (Mg) and iron (Fe) in the vicinity of the interface between the gallium nitride substrate and the epitaxial film. Furthermore, it can reduce the decrease in the carrier concentration due to impurities such as beryllium (Be), calcium (Ca), zinc (Zn), cadmium (Cd), titanium (Ti), cobalt (Co), nickel (Ni), vanadium (V), chromium (Cr), and manganese (Mn) as well as magnesium (Mg) and iron (Fe).

The donor concentration of the gallium nitride epitaxial film 65 may be $5 \times 10^{17}$ cm$^{-3}$ or less, and the donor impurity of the gallium nitride substrate 63 may contain oxygen. Alternatively, the donor impurity of the gallium nitride substrate 63 may contain silicon. According to the epitaxial substrate 61, a depletion layer can be sufficiently formed in the gallium nitride epitaxial film 65, and it is possible to reduce the decrease in the carrier concentration in the vicinity of the interface between the gallium nitride substrate and the epitaxial film, so that the epitaxial substrate 61 is preferable to gallium nitride vertical semiconductor devices having a high breakdown voltage.

Embodiment Mode 4

Figure 7:
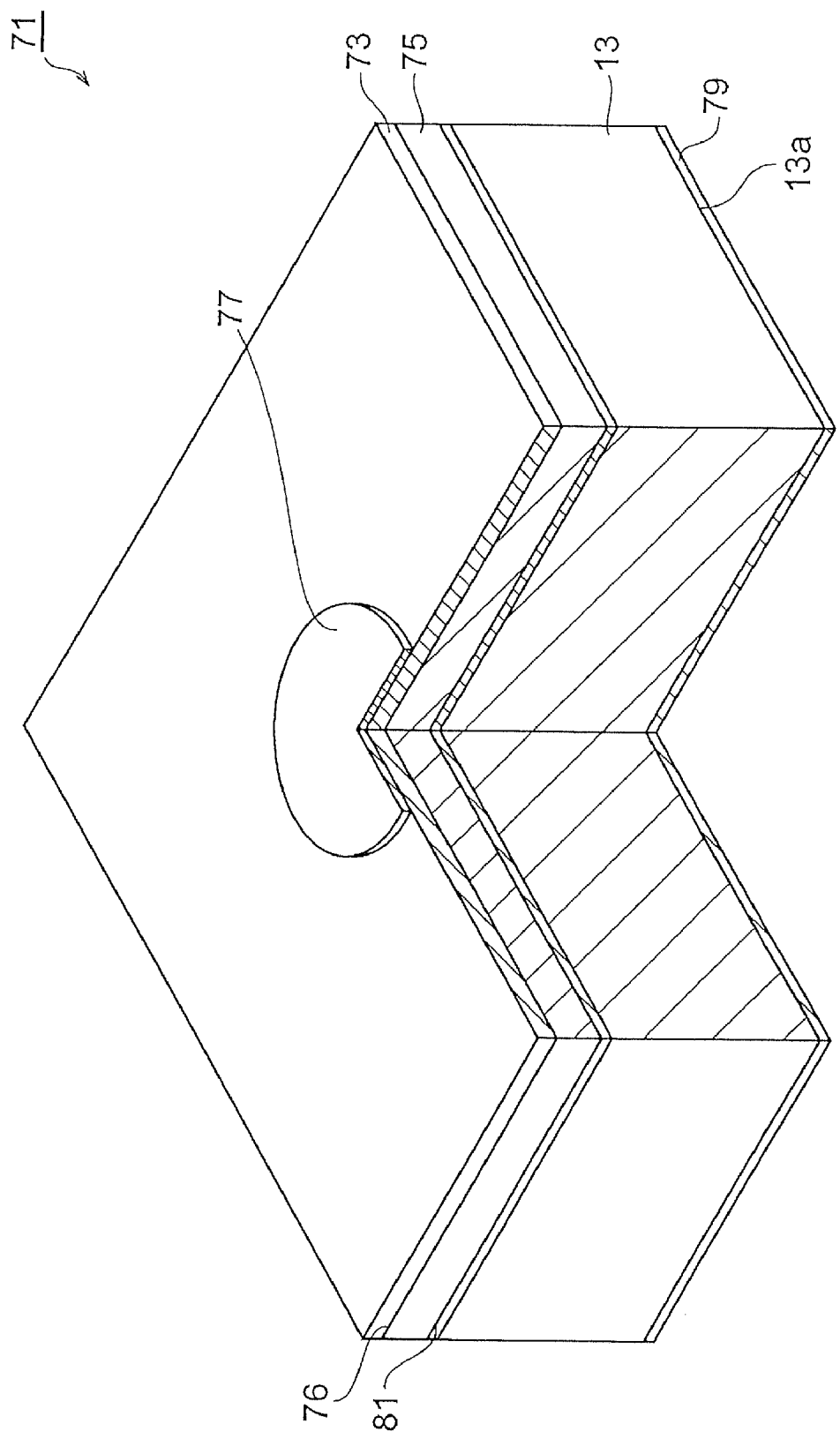
FIG. 7 is a view depicting a pn junction diode.

FIG. 7 is a view depicting a pn junction diode. The pn junction diode 71 is made up of a gallium nitride support base 13 of n-type conductivity, a gallium nitride epitaxial film 73 of p-type conductivity, a gallium nitride epitaxial film 75 of n⁻-type conductivity, a first ohmic electrode 77, and a second ohmic electrode 79. The gallium nitride epitaxial film 75 of n⁻-type conductivity is provided on the principal surface of the gallium nitride support base 13. The gallium nitride epitaxial film 73 of p-type conductivity is provided on the gallium nitride epitaxial film 75 of n⁻-type conductivity. The first ohmic electrode 77 is provided on the gallium nitride epitaxial film 73 of p-type conductivity. The second ohmic electrode 79 is provided on a back side 13a of the gallium nitride support base 13. The gallium nitride epitaxial film 73 of p-type conductivity and the gallium nitride epitaxial film 75 of n⁻-type conductivity constitute a pn junction 76. Concentration of donor impurity along an axis from the gallium nitride support base 13 to the gallium nitride epitaxial film 73 is $1 \times 10^{18}$ cm$^{-3}$ or more. The layer region 81 is provided in the surface of the gallium nitride support base 13 and the gallium nitride epitaxial film 75 of n⁻-type conductivity. The donor impurity is at least either silicon or germanium.

According to the above-described pn junction diode 71, the donor impurity concentration profile of the layer region 81 is $1 \times 10^{18}$ cm$^{-3}$ or more, so that it is possible to reduce the decrease in the carrier concentration due to impurities such as magnesium (Mg) and iron (Fe) in the vicinity of the interface between the gallium nitride support base and the epitaxial film. The donor concentration of the gallium nitride epitaxial film 75 may be $5 \times 10^{17}$ cm$^{-3}$ or less.

Implementation Example 2

An epitaxial substrate was manufactured according to a following process. A gallium nitride (GaN) freestanding substrate manufactured by HVPE method was prepared. The GaN substrate has a principal surface of (0001) plain in the plane orientation. The GaN substrate has $n^+$ conductivity. The substrate had a carrier concentration of $3\times10^{18}$ cm$^{-3}$ and a thickness of 400 µm. The average dislocation density in the substrate is $1\times10^6$ cm$^{-2}$ or less. A GaN epitaxial film was grown on the principal surface of the freestanding substrate by metal organic chemical vapor deposition. The epitaxial film had $n^-$-type conductivity. The film had a carrier concentration of $5\times10^{15}$ cm$^{-3}$ and a thickness of 10 µm. On the GaN epitaxial film was provided a first gallium nitride epitaxial film of p-type conductivity. The first gallium nitride epitaxial film of p-type conductivity had a magnesium concentration of $1\times10^{18}$ cm$^{-3}$ and a thickness of 0.5 µm. If necessary, on the first gallium nitride epitaxial film of p-type conductivity is provided a second gallium nitride epitaxial film of p-type conductivity. The second gallium nitride epitaxial film of p-type conductivity had a magnesium concentration of $5\times10^{19}$ cm$^{-3}$ and a thickness of 0.05 µm. At an interface of the GaN freestanding substrate and the GaN epitaxial layer was provided an $n^+$ GaN layer region having silicon of $5\times10^{18}$ cm$^{-3}$ or more. In order to form the layer region, silicon could be added into the surface of the substrate or the epitaxial film.

Then, by using the epitaxial substrate, a pn diode was manufactured according to a following procedure. After the organic wash of the sample, an ohmic electrode was formed on an overall surface of the back side of the GaN freestanding substrate. In order to form the ohmic electrode, after depositing a metal deposition film by EB vapor deposition, an alloying process was performed. The alloying process was performed at 600 degrees Celsius for one minute, for example. In addition, an ohmic electrode was formed on the epitaxial film. The ohmic electrode had a radius of 200 µm, for example. In order to manufacture the ohmic electrode, after depositing a metal deposition film by EB vapor deposition, an alloying process was performed. The alloying process was performed at 600 degrees Celsius for one minute. The sample was pretreated with aqueous hydrochloric acid (hydrochloric acid for semiconductors:ultrapure water=1:1) in advance of manufacturing both the ohmic electrodes.

Peaks of Mg and Fe were detected in the vicinity of the interface between the epitaxial layer and the substrate by SIMS method. The peak concentration of magnesium was $1\times10^{16}$ cm$^{-3}$ or less, and the peak concentration of iron was $1\times10^{17}$ cm$^{-3}$ or less. As mentioned above, since it is possible to reduce effect of compensation of the carrier due to magnesium or iron in the vicinity of the interface, it is possible to reduce on-resistance of the above-described pn diode, to reduce the forward rise voltage, and to improve the breakdown voltage.

As described above, the gallium nitride vertical electronic device (the gallium nitride pn junction diode 71, for example) includes the homoepitaxial film 75 of low concentration on the gallium nitride substrate 13. However, it is difficult to control the carrier concentration in the vicinity of the interface of the low concentration because the impurities such as magnesium and iron are likely to be concentrated in the vicinity of the interface between the gallium nitride substrate and the homoepitaxial film. Therefore, the present invention makes use of the layer region having a relatively high concentration provided in the vicinity of the interface to reduce the effects by the impurities and to maintain the carrier concentration of the epitaxial film apart from the interface to a desired low concentration. As a result, it is possible to remove the electrical affects due to the affects of the impurities, so that the forward resistance or the on-resistance of the gallium nitride pn junction diode 71 can be reduced and the backward breakdown voltage can be improved.

Although principles of the present invention are described with illustrations in the preferable embodiments, it is apparent for the skilled person that the present invention can be altered in locations and details without departing the principles of the present invention. The present invention is not limited to specific configurations shown in the embodiments. Although the n type donor impurities can be added during the growth in the embodiment, they can exist in the substrate (on the surface and/or inside of the substrate) in advance of the epitaxial growth. Accordingly, rights on all modifications and alternations deriving from the scope of claims and the spirit of that scope are claimed.

The invention claimed is:

1. A vertical gallium nitride semiconductor device furnished with:
    a gallium nitride support base of $n^+$-type conductivity, therein having a given carrier concentration;
    a gallium nitride epitaxial film of $n^-$-type conductivity provided on a principal surface of said gallium nitride support base, therein defining an interface between said gallium nitride support base and said gallium nitride epitaxial film;
    a laminar region, of not greater than 1 µm thickness, including the interface between said gallium nitride support base and said gallium nitride epitaxial film, where either said gallium nitride support base or said gallium nitride epitaxial film has at least either silicon or germanium as donor impurities at a concentration, along an axis from said gallium nitride support base to said gallium nitride epitaxial film, of not less than $1\times10^{18}$ cm$^{-3}$, wherein the presence of magnesium, beryllium, calcium, zinc, or cadmium as unintentional impurities in the vertical gallium nitride semiconductor device assumes a concentration profile whose peak resides in said laminar region;
    a gate insulating film provided on said gallium nitride epitaxial film;
    a gate electrode provided on said gate insulating film;
    a p-type conductivity region provided on said gallium nitride epitaxial film;
    an $n^+$-type conductivity region provided in said p-type conductivity region;
    a source electrode provided on said $n^+$-type conductivity region of said gallium nitride epitaxial film; and
    a drain electrode provided on a back side of said gallium nitride support base.

2. A vertical gallium nitride semiconductor device furnished with:
    a gallium nitride support base of $n^+$-type conductivity, therein having a given carrier concentration;
    a gallium nitride epitaxial film of $n^-$-type conductivity provided on a principal surface of said gallium nitride support base, therein defining an interface between said gallium nitride support base and said gallium nitride epitaxial film;
    a laminar region, of not greater than 1 µm thickness, including the interface between said gallium nitride support base and said gallium nitride epitaxial film, where either said gallium nitride support base or said gallium nitride epitaxial film has at least either silicon or germanium as donor impurities at a concentration, along an axis from said gallium nitride support base to said gallium nitride epitaxial film, of not less than $1\times10^{18}$ cm$^{-3}$, wherein the presence of magnesium, beryllium, calcium, zinc, or cadmium as unintentional impurities in the vertical gallium nitride semiconductor device assumes a concentration profile whose peak resides in said laminar region;
a Schottky electrode provided on said gallium nitride epitaxial film; and
an ohmic electrode provided on a back side of said gallium nitride support base.

3. A vertical gallium nitride semiconductor device furnished with:
a gallium nitride support base of n⁺-type conductivity, therein having a given carrier concentration;
a gallium nitride epitaxial film of n⁻-type conductivity provided on a principal surface of said gallium nitride support base, therein defining an interface between said gallium nitride support base and said gallium nitride epitaxial film;
a laminar region, of not greater than 1 μm thickness, including the interface between said gallium nitride support base and said gallium nitride epitaxial film, where either said gallium nitride support base or said gallium nitride epitaxial film has at least either silicon or germanium as donor impurities at a concentration, along an axis from said gallium nitride support base to said gallium nitride epitaxial film, of not less than $1\times10^{18}$ cm$^{-3}$, wherein the presence of magnesium, beryllium, calcium, zinc, or cadmium as unintentional impurities in the vertical gallium nitride semiconductor device assumes a concentration profile whose peak resides in said laminar region;
a gallium nitride epitaxial film of p-type conductivity provided on said gallium nitride epitaxial film;
a first ohmic electrode provided on said gallium nitride epitaxial film of p-type conductivity; and
a second ohmic electrode provided on a back side of said gallium nitride support base.

4. The vertical gallium nitride semiconductor device set forth in any of claims 1 through 3, characterized in that:
donor concentration of said gallium nitride epitaxial film is $5\times10^{17}$ cm$^{-3}$ or less, and
said donor impurity of said gallium nitride support base includes oxygen or silicon.

5. An epitaxial substrate furnished with:
a gallium nitride substrate of n⁺-type conductivity, therein having a given carrier concentration; and
a gallium nitride epitaxial film of n⁻-type conductivity provided on said gallium nitride substrate, therein defining an interface between said gallium nitride substrate and said gallium nitride epitaxial film; and
a laminar region, of not greater than 1 μm thickness, including the interface between said gallium nitride substrate and said gallium nitride epitaxial film, where either said gallium nitride substrate or said gallium nitride epitaxial film has at least either silicon or germanium as donor impurities at a concentration, along an axis from said gallium nitride substrate to said gallium nitride epitaxial film, of not less than $1\times10^{18}$ cm$^{-3}$, wherein the presence of magnesium, beryllium, calcium, zinc, or cadmium as unintentional impurities in the vertical gallium nitride semiconductor device assumes a concentration profile whose peak resides in said laminar region.

6. An epitaxial substrate furnished with:
a gallium nitride substrate of n⁺-type conductivity, therein having a given carrier concentration;
a gallium nitride epitaxial film of n⁻-type conductivity provided on said gallium nitride substrate, therein defining an interface between said gallium nitride substrate and said gallium nitride epitaxial film;
a laminar region, of not greater than 1 μm thickness, including the interface between said gallium nitride substrate and said gallium nitride epitaxial film, where either said gallium nitride substrate or said gallium nitride epitaxial film has at least either silicon or germanium as donor impurities at a concentration, along an axis from said gallium nitride substrate to said gallium nitride epitaxial film, of not less than $1\times10^{18}$ cm$^{-3}$, wherein the presence of magnesium, beryllium, calcium, zinc, or cadmium as unintentional impurities in the vertical gallium nitride semiconductor device assumes a concentration profile whose peak resides in said laminar region; and
a gallium nitride epitaxial film of p-type conductivity provided on said gallium nitride epitaxial film of n-type conductivity.

7. The epitaxial substrate set forth in claim 5 or 6, characterized in that:
donor concentration of said gallium nitride epitaxial film is $5\times10^{17}$ cm$^{-3}$ or less, and
said gallium nitride substrate includes oxygen or silicon as a donor impurity.

8. A vertical gallium nitride semiconductor device furnished with:
a gallium nitride support base of n⁺-type conductivity, therein having a given carrier concentration;
a gallium nitride epitaxial film of n⁻-type conductivity provided on a principal surface of said gallium nitride support base, therein defining an interface between said gallium nitride support base and said gallium nitride epitaxial film;
a laminar region, of not greater than 1 μm thickness, including the interface between said gallium nitride support base and said gallium nitride epitaxial film, where either said gallium nitride support base or said gallium nitride epitaxial film has at least either silicon or germanium as donor impurities at a concentration, along an axis from said gallium nitride support base to said gallium nitride epitaxial film, of not less than $1\times10^{18}$ cm$^{-3}$, wherein the presence of iron titanium, cobalt, nickel, vanadium, chromium, or manganese as unintentional impurities in the vertical gallium nitride semiconductor device assumes a concentration profile whose peak resides in said laminar region;
a gate insulating film provided on said gallium nitride epitaxial film;
a gate electrode provided on said gate insulating film;
a p-type conductivity region provided on said gallium nitride epitaxial film;
an n⁺-type conductivity region provided in said p-type conductivity region;
a source electrode provided on said n⁺-type conductivity region of said gallium nitride epitaxial film; and
a drain electrode provided on a back side of said gallium nitride support base.

9. A vertical gallium nitride semiconductor device furnished with:
a gallium nitride support base of n⁺-type conductivity, therein having a given carrier concentration;
a gallium nitride epitaxial film of n⁻-type conductivity provided on a principal surface of said gallium nitride support base, therein defining an interface between said gallium nitride support base and said gallium nitride epitaxial film;
a laminar region, of not greater than 1 μm thickness, including the interface between said gallium nitride support base and said gallium nitride epitaxial film, where either said gallium nitride support base or said gallium nitride epitaxial film has at least either silicon or germanium as donor impurities at a concentration, along an axis from said gallium nitride support base to said gallium nitride epitaxial film, of not less than $1\times10^{18}$ cm$^{-3}$, wherein the presence of iron titanium, cobalt, nickel, vanadium, chromium, or manganese as unintentional impurities in the vertical gallium nitride semiconductor device assumes a concentration profile whose peak resides in said laminar region;

a Schottky electrode provided on said gallium nitride epitaxial film; and an ohmic electrode provided on a back side of said gallium nitride support base.

10. A vertical gallium nitride semiconductor device furnished with:

a gallium nitride support base of n$^+$-type conductivity, therein having a given carrier concentration;

a gallium nitride epitaxial film of n$^-$-type conductivity provided on a principal surface of said gallium nitride support base, therein defining an interface between said gallium nitride support base and said gallium nitride epitaxial film;

a laminar region, of not greater than 1 μm thickness, including the interface between said gallium nitride support base and said gallium nitride epitaxial film, where either said gallium nitride support base or said gallium nitride epitaxial film has at least either silicon or germanium as donor impurities at a concentration, along an axis from said gallium nitride support base to said gallium nitride epitaxial film, of not less than $1\times10^{18}$ cm$^{-3}$, wherein the presence of iron titanium, cobalt, nickel, vanadium, chromium, or manganese as unintentional impurities in the vertical gallium nitride semiconductor device assumes a concentration profile whose peak resides in said laminar region;

a gallium nitride epitaxial film of p-type conductivity provided on said gallium nitride epitaxial film;

a first ohmic electrode provided on said gallium nitride epitaxial film of p-type conductivity; and a second ohmic electrode provided on a back side of said gallium nitride support base.

11. An epitaxial substrate furnished with:

a gallium nitride substrate of n$^+$-type conductivity, therein having a given carrier concentration; and a gallium nitride epitaxial film of n$^-$-type conductivity provided on said gallium nitride substrate, therein defining an interface between said gallium nitride substrate and said gallium nitride epitaxial film; and a laminar region, of not greater than 1 μm thickness, including the interface between said gallium nitride substrate and said gallium nitride epitaxial film, where either said gallium nitride substrate or said gallium nitride epitaxial film has at least either silicon or germanium as donor impurities at a concentration, along an axis from said gallium nitride substrate to said gallium nitride epitaxial film, of not less than $1\times10^{18}$ cm$^{-3}$, wherein the presence of iron titanium, cobalt, nickel, vanadium, chromium, or manganese as unintentional impurities in the vertical gallium nitride semiconductor device assumes a concentration profile whose peak resides in said laminar region.

12. An epitaxial substrate furnished with:

a gallium nitride substrate of n$^+$-type conductivity, therein having a given carrier concentration;

a gallium nitride epitaxial film of n$^-$-type conductivity provided on said gallium nitride substrate, therein defining an interface between said gallium nitride substrate and said gallium nitride epitaxial film;

a laminar region, of not greater than 1 μm thickness, including the interface between said gallium nitride substrate and said gallium nitride epitaxial film, where either said gallium nitride substrate or said gallium nitride epitaxial film has at least either silicon or germanium as donor impurities at a concentration, along an axis from said gallium nitride substrate to said gallium nitride epitaxial film, of not less than $1\times10^{18}$ cm$^{-3}$, wherein the presence of iron titanium, cobalt, nickel, vanadium, chromium, or manganese as unintentional impurities in the vertical gallium nitride semiconductor device assumes a concentration profile whose peak resides in said laminar region; and a gallium nitride epitaxial film of p-type conductivity provided on said gallium nitride epitaxial film of n-type conductivity.

13. The vertical gallium nitride semiconductor device set forth in claim 1, characterized in that the peak concentration of magnesium, beryllium, calcium, zinc, or cadmium is $5\times10^{14}$ cm$^{-3}$ to $1\times10^{16}$ cm$^{-3}$.

14. The vertical gallium nitride semiconductor device set forth in claim 2, characterized in that the peak concentration of magnesium, beryllium, calcium, zinc, or cadmium is $5\times10^{14}$ cm$^{-3}$ to $1\times10^{16}$ cm$^{-3}$.

15. The vertical gallium nitride semiconductor device set forth in claim 3, characterized in that the peak concentration of magnesium, beryllium, calcium, zinc, or cadmium is $5\times10^{14}$ cm$^{-3}$ to $1\times10^{16}$ cm$^{-3}$.

16. The vertical gallium nitride semiconductor device set forth in claim 5, characterized in that the peak concentration of magnesium, beryllium, calcium, zinc, or cadmium is $5\times10^{14}$ cm$^{-3}$ to $1\times10^{16}$ cm$^{-3}$.

17. The vertical gallium nitride semiconductor device set forth in claim 6, characterized in that the peak concentration of magnesium, beryllium, calcium, zinc, or cadmium is $5\times10^{14}$ cm$^{-3}$ to $1\times10^{16}$ cm$^{-3}$.

18. The vertical gallium nitride semiconductor device set forth in claim 8, characterized in that the peak concentration of iron, titanium, cobalt, nickel, vanadium, chromium, or manganese is $1\times10^{15}$ cm$^{-3}$ to $1\times10^{17}$ cm$^{-3}$.

19. The vertical gallium nitride semiconductor device set forth in claim 9, characterized in that the peak concentration of iron, titanium, cobalt, nickel, vanadium, chromium, or manganese is $1\times10^{15}$ cm$^{-3}$ to $1\times10^{17}$ cm$^{-3}$.

20. The vertical gallium nitride semiconductor device set forth in claim 10, characterized in that the peak concentration of iron, titanium, cobalt, nickel, vanadium, chromium, or manganese is $1\times10^{15}$ cm$^{-3}$ to $1\times10^{17}$ cm$^{-3}$.

21. The vertical gallium nitride semiconductor device set forth in claim 11, characterized in that the peak concentration of iron, titanium, cobalt, nickel, vanadium, chromium, or manganese is $1\times10^{15}$ cm$^{-3}$ to $1\times10^{17}$ cm$^{-3}$.

22. The vertical gallium nitride semiconductor device set forth in claim 12, characterized in that the peak concentration of iron, titanium, cobalt, nickel, vanadium, chromium, or manganese is $1\times10^{15}$ cm$^{-3}$ to $1\times10^{17}$ cm$^{-3}$.

* * * * *